US006534843B2

(12) United States Patent
Acosta et al.

(10) Patent No.: US 6,534,843 B2
(45) Date of Patent: Mar. 18, 2003

(54) HIGH Q INDUCTOR WITH FARADAY SHIELD AND DIELECTRIC WELL BURIED IN SUBSTRATE

(75) Inventors: Raul E. Acosta, White Plains, NY (US); Jennifer L. Lund, Amawalk, NY (US); Robert A. Groves, Highland, NY (US); Joanna Rosner, Hastings-on-Hudson, NY (US); Steven A. Cordes, Yorktown Heights, NY (US); Melanie L. Carasso, West Pennant Hills (AU)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/781,014

(22) Filed: Feb. 10, 2001

(65) Prior Publication Data

US 2002/0109204 A1 Aug. 15, 2002

(51) Int. Cl.[7] ........................ H01L 29/00

(52) U.S. Cl. ........................ 257/531; 257/534; 257/539; 257/500; 257/338; 257/351

(58) Field of Search ........................ 257/531, 534, 257/539, 500, 338, 351, 357

(56) References Cited

U.S. PATENT DOCUMENTS

| | | | | | |
|---|---|---|---|---|---|
| 5,446,311 | A | | 8/1995 | Ewen et al. | 257/531 |
| 5,559,360 | A | | 9/1996 | Chiu et al. | 257/531 |
| 5,736,749 | A | * | 4/1998 | Xie | 257/3 |
| 5,742,091 | A | * | 4/1998 | Hebert | 257/531 |
| 5,760,456 | A | | 6/1998 | Grzegorek et al. | 257/531 |
| 5,793,272 | A | | 8/1998 | Burghartz et al. | 336/200 |
| 5,861,647 | A | | 1/1999 | Zhao et al. | 257/296 |
| 5,884,990 | A | | 3/1999 | Burghartz et al. | 336/200 |
| 5,918,121 | A | | 6/1999 | Wen et al. | 438/243 |
| 5,959,515 | A | | 9/1999 | Cornett et al. | 334/14 |
| 5,959,522 | A | | 9/1999 | Andrews | 336/200 |
| 6,008,102 | A | | 12/1999 | Alford et al. | 438/381 |
| 6,037,649 | A | | 3/2000 | Liou | 257/531 |
| 6,046,109 | A | | 4/2000 | Liao et al. | 438/689 |
| 6,054,329 | A | | 4/2000 | Burghartz et al. | 438/3 |
| 6,057,202 | A | * | 5/2000 | Chen et al. | 438/381 |

(List continued on next page.)

OTHER PUBLICATIONS

"Large Suspended Inductors on Silicon and Their Use in a 2–um CMOS RF Amplifier", J.Y.–C. Chang & Michael Gaitan, IEEE Electron Device Letters, vol. 14, No. 5, May 1993.

"High Performance Planar Inductor on Thick Oxidized Porous Silicon (OPS) Substrate", Choong–Mo Nam & Young–Se Kwon, IEEE Microwave and Guided Wave Letters, vol. 7, No. 8, Aug. 1997.

"A Novel High–Q and Wide–Frequency–Range Inductor Using Si 3–D MMIC Technology", Kenji Kamogawa, Kenjiro Nishikawa, Ichihiko Toyoda, Tsuneo Tokumitsu & Masayoshi Tanaka, IEEE Microwave and Guided Wave Letters, vol. 9, No. 1, Jan. 1999.

"Silicon:germanium–based mixed–signal technology for optimization of wired and wireless telecommunications", B.S. Meyerson, IBM Journal of Research & Development, vol. 44, No. 3, 18 pages from http://www.research.ibm.com/journal/rd/443/meyerson.html.

*Primary Examiner*—Nathan J. Flynn
*Assistant Examiner*—Remmon R. Fordé
(74) *Attorney, Agent, or Firm*—Judith D. Olsen; Robert M. Trepp

(57) ABSTRACT

Inductor losses to a semiconducting substrate are eliminated in an IC structure by etching a well into the substrate down to the insulating layer coating the substrate and fabricating a grounded Faraday shield in the shape of elongated segments in the bottom of the well. The well lies directly below the inductor and is optionally filled with cured low-k organic dielectric or air.

6 Claims, 8 Drawing Sheets

U.S. PATENT DOCUMENTS 6,114,937 A 9/2000 Burhartz et al. ............ 336/200
6,124,624 A 9/2000 Van Roosmalen et al. .. 257/531
6,146,958 A 11/2000 Zhao et al. ................. 438/381
6,153,489 A 11/2000 Park et al. .................. 438/381
6,169,008 B1 1/2001 Wen et al. .................. 438/381
6,261,892 B1 * 7/2001 Swanson .................... 438/238
6,285,069 B1 * 9/2001 Yoshida ...................... 257/531

* cited by examiner

FIG.1

$$Q = \frac{\omega\,(\text{maximum energy stored per cycle})}{(\text{average power dissipated per cycle})}$$

Where Q = Quality factor; and
$\omega$ = angular frequency.

SPIRAL OVER DIELECTRIC / ORGANIC FILLED WELL

SPIRAL OVER ORGANIC FILLED WELL
WITH VIAS USED FOR ORGANIC RELEASE

SPIRAL OVER RELEASED WELL

HIGH Q INDUCTOR WITH FARADAY SHIELD AND DIELECTRIC WELL BURIED IN SUBSTRATE

TECHNICAL FIELD

This invention relates to the design and construction of high-Q inductors within high frequency integrated circuits.

BACKGROUND

The present environment sees the rapid proliferation of wireless communications and the wireless products such as modems, pagers, 2-way radios, oscillators and cell phones which include integrated circuits (ICs) having inductors which operate at high frequencies. There is pressure to make these products more and more efficient, compact, light weight and reliable at radio frequency and microwave frequency. It is efficient and economically desirable to fabricate the maximum number of required devices and elements, including inductors, in a single IC and to limit the number and type of processing steps to ones which are consistent with those presently practiced in IC manufacturing. Pushing the performance of conventional integrated circuits into the high frequency range reveals limitations that must be overcome in order to achieve the desired goal. The inductor is one area which has been examined for optimization.

Quality Factor Q is the commonly accepted indicator of inductor performance in an IC. Q is a measure of the relationship between power loss and energy storage in an inductor expressed as an equation shown as FIG. 1. A high value for Q is consistent with sow inductor and substrate loss, low series resistance and high inductance. High frequency is considered be greater than about 500 MHz. To achieve a Q of greater than about 10 would be desirable for that frequency range. The technology of manufacturing ICs over silicon substrates is well established. Unfortunately, a planar spiral inductor fabricated in an IC having a silicon substrate typically experiences high losses at RF, and consequently low Q value. Losses experienced are a result of several factors. Electromagnetic fields generated by the inductor adversely affect the semiconducting silicon substrate as well as devices and conductive lines of which the IC is comprised. The result of this interaction is loss due to coupling, cross talk noise, resistance, parasitic capacitance, reduced inductance and lowering of Q values. Elements of Q with respect to a specific spiral conductor over a silicon substrate are set forth in U.S. Pat. No. 5,760,456, col. 1, line 55 - ff.

One approach to improving the Q factor is to alter the materials of which the IC is comprised. Using substrates other than silicon, such as GaAs and sapphire is possible. However, it would be desirable to maintain manufacturing processes which are as compatible as possible with existing silicon technology, which is well established, rather than to introduce the process changes and to deal with the attendant problems associated with the use of non-silicon substrate materials. U.S. Pat. No. 6,046,109 to Liao et al. describes one approach to improving Q of an IC on a silicon substrate—the creation of isolating regions to separate the inductor from other regions or devices that would otherwise be adversely affected. The isolating regions are created by radiation of, for example, selected silicon semiconductor regions with a high energy beam such as x-rays or gamma rays or by particles such as protons and deuterons, which results in an increase in resistivity of the irradiated area. The depth of penetration of the radiation can be as deep as required to reduce noise, line loss and assure device separation.

Another approach to improving the Q factor is to alter the shape and dimensionality of the inductor itself in order to overcome inherent limitations of the flat spiral inductor. U.S. Pat. No. 6,008,102 to Alford et al. describes two such shapes, toroidal and helical, which are formed in such a way as to align magnetic fields generated by RF currents within the shaped inductor, thereby minimizing dielectric losses, cross talk and increasing Q.

U.S. Pat. Nos. 6,114,937, 5,884,990, 5,793,272 and 6,054,329 to Burghartz et al. describe high Q toroidal and spiral inductors with silicon substrate for use at high frequencies. There are described several embodiments which focus on raising Q by increasing inductance. Devices described that are incorporated in the IC in order to raise Q include: a substrate coated with a dielectric layer having a spiral trench which is capped and lined with a ferromagnetic material in which lies the spiral inductor, connected by via to underpass contact; and/or a second spiral inductor either above or adjacent to the first, the two coils being connected to each other by a ferromagnetic bridge and externally, if stacked, by an overpass. The toroidal inductor is similarly formed in dielectric trenches lined with ferromagnetic material, the coils being segmented to reduce eddy currents and the segments being separated from each other by dielectric, increasing the Q. Studs connect the opposite ends. The ferromagnetic bridge and dummy central structures or air core are stated to increase the Q by reducing flux penetration into the substrate thereby increasing inductance. Use of copper, a low resistance material, in thick interconnects reduces parasitic resistance, further increasing Q. (Aluminum has generally been used.) The patent describes results of Q=40 @ 5.8 GHz for a 1.4 nH inductor and Q=13 @ 600 MHz for a 80 nH inductor, twice or triple the Q than conventional silicon-based integrated inductors.

U.S. Pat. No. 6,037,649 to Liou describes a a three-dimensional coil inductor structure, optionally including a shielding ring, which comprises N-turn coil lines in three levels, separated from each other and the substrate by isolating layers and connected through vias. It is described that the structure of the invention, in which the magnetic field is normal to the substrate, provides lower series resistance than a flat structure, less effect on the other components of the IC, lower parasitic capacitance and higher Q at RF and microwave frequencies.

U.S. Pat. No. 5,559,360 to Chiu et al. describes a multi-level multielement structure that maintains a constant distance between parallel conductive elements, thereby equalizing each element's resistance. The solution is intended to minimize current crowding, especially at conductor widths beyond 15 microns, and maximize self-inductance between conductive elements, possibly raising the Q to 15 for Al conductor over Si substrate.

U.S. Pat. No. 5,446,311 to Ewen et al. describes a multilevel inductor constructed on a silicon substrate which is layered with insulating oxide. The inductors are connected in parallel to avoid series resistance and the metal levels are shunted by vias. A Q of 7 at 2.4 GHz is reported.

U.S. Pat. No. 6,124,624 to Van Roosmalen et al. describes a multilevel inductor comprised of closely spaced stacks of parallel connected elongated rectangular strips in which bridging crossover and/or cross/under is avoided. The levels are separated by silicon dioxide. The structure is stated to raise the Q, possibly over 25 @ 2 GHz, by a reduction of series resistance using various series and parallel connections through vias and by enhanced mutual inductance of layered strips. A staggered stacking is stated to contribute to high Q by reducing parasitic capacitance.

U.S. Pat. No. 6,146,958 to Zhao et al. describes a reduction in series resistance, hence an increase in Q, by connecting a spiral inductor at a lower level to one at a higher level by a continuous via.

Another approach to improving the Q factor is to create shielding or zones within the IC which include materials, or open space, that control or limit the extent that electromagnetic lines can penetrate the IC, thereby reducing substrate losses. U.S. Pat. No. 6,169,008B1 to Wen et al. describes forming a 3–5 micron deep trench in the dielectric substrate of an IC, and filling the trench with a high resistivity epitaxy layer which has a lower dopant concentration than the substrate by several orders of magnitude and will therefor act as a dielectric. The epitaxy layer is etched back, a dielectric layer is deposited over all and the inductor windings on the dielectric layer, thereby increasing the resistivity between the substrate and the windings and increasing Q.

A publication "Large Suspended Inductors on Silicon and Their Use in a 2 micron CMOS RF Amplifier" in IEEE Electron Device Letters, Vol. 14, No. 5 by Chang et al. describes creating a high-Q spiral inductor by selectively etching a 200–500 micron deep cavity underneath a spiral inductor to minimize substrate losses and raise Q.

U.S. Pat. No. 5,959,522 to Andrews describes a structure having upper and lower high magnetic permeability, i.e. greater than about 1.1, shielding layers between which is a layer comprising a spiral induction coil, optionally including an annular ring. Through an open central area designed to reduce series resistance, eddy currents and dissipative resistive currents the shielding layers are coupled to each other and concentrate the current-induced magnetic flux. The concentration of magnetic flux Permits increased inductance in a smaller area. A pattern of radial projections of the shielding layers increases the effective conductance. If the lower shielding level is nonconductive, it also functions as electrical shielding to the substrate and raise Q.

U.S. Pat. No. 5,760,456 to Grzegorek et al. describes the interposition of a patterned segmented conductive plane, having an oxide insulating layer covering both top and bottom surfaces, which functions as an electrostatic shield between the substrate level and the spiral inductor level. The conductive plane, which includes a perimeter region electrically connected to a fixed low impedance reference voltage, comprises metal, polysilicon or a heavily doped region of the substrate. Provided its distance from the inductor is sufficient, the design and location of the conductive plane is said to minimize parasitic capacitance, the flow of eddy currents and inhibit the flow of the electric field current to the substrate, increasing the Q, while minimizing the surface area of the inductor also minimizes the series resistance, increasing the Q It is stated that the invention provides a Q of up to about 6 at a frequency of about 2 GHz.

U.S. Pat. No. 5,918,121 to Wen et al. maintains the concept of a flat spiral inductor over a silicon substrate and focuses on minimizing loss between the inductor and the substrate by forming an epitaxial area having a resistivity of thousands of ohm-cm, such as silicon lightly doped with such materials as arsenic and phosphorous. The epitaxial area lies surrounded on the top and sides by an oxide insulator and atop the substrate, which has a resistivity of about 10 to about 20 ohm-cm. The planar inductor, which is enclosed on the top and sides by an intermetalic dielectric, lies directly on the that part of the oxide layer which is directly on top of epitaxial area. The stated result is a reduction of loss of induction current to the substrate, and improved Q.

U.S. Pat. No. 6,153,489 to Park et al. describes forming a trench within the silicon substrate which is filled with an insulating porous silicon, which is a high resistivity material, coating with a dielectric layer on which is formed a lower metal line and a second dielectric layer followed by a spiral inductor pattern which is connected to the metal line by a via. Alternatively, the spiral can be formed within the porous silicon layer. In another alternative a high concentration of dopants of the opposite conductivity type to that of the substrate is implanted in the trench before filling the trench with porous silicon, and forming a polysilicon trench electrode at a point adjacent to and connected with the porous silicon. Instead of ion implanting to form a conductive doped layer, highly doped polysilicon can be used Application of a reverse bias voltage between the substrate and the doped layer creates a P-N junction depletion layer in the substrate. The resulting structure is stated to further decrease parasitic capacitance and minimize loss from metal levels to substrate, increasing the Q.

Another approach to improving the Q factor is redesign of IC real estate. U.S. Pat. No. 5,959,515 to Cornett et al. describes effectively reducing the cross-under length of the inductor, i.e. the length of the conductor line between the inner turn of the spiral inductor to the outside connection, by leaving open a center around which is loosely wrapped the turns of the spiral inductor. The patent describes remote placement of devices from the L–C tank circuit to eliminate cross under and parasitic interconnection resistance in a resonator, enhancing Q.

The structure and process of the present invention are not described in the related art. The well in the present invention is created deep into the substrate. The position of the shield in the substrate with an insulating layer below and a low-k dielectric filling the deep well above it minimizes the parasitic capacitive coupling to the substrate and to devices. Reduction of the parasitic capacitance increases the self-resonating frequency of the spiral inductor, resulting in increased Q. The dielectric layers in the present invention do not need to be thick overall, necessitating high aspect ratio connecting vias, in order to reduce capacitive coupling to the substrate. In the present invention the capacitive coupling between the inductor and the substrate is reduced by increasing the dielectric thickness only directly under the inductor and at a uniform distance from each turn of the inductor. Placing the shield in the bottom of the dielectric-filled well in the present invention lowers the parasitic capacitance between the inductor and the shield, which increases the self resonant frequency of the inductor spiral. The elongated segmented shape of the shield reduces eddy currents. The process of the present invention can be smoothly integrated into new and existing technologies. Increasing the spacing between the inductor coil and the substrate using a true, organic dielectric decreases parasitic capacitance, and the placing of a patterned conductive shield (ground plane) on the substrate at the bottom of well terminates any remaining parasitic field before it reaches the substrate. The two contributions taken together increase the Q.

SUMMARY OF THE INVENTION

An object of the invention is to provide within an IC structure a high-Q inductor suitable for use in a high frequency environment.

A further object of the invention is to maximize the value of Q of an integrated inductor by eliminating the losses caused by the penetration of parasitic electrical fields emanating from the inductor into the substrate.

A further object of the invention is to achieve the above objects using processes and materials which are compatible with those conventionally employed in IC manufacturing.

These and additional objects are achieved in the present invention in which the capacitive coupling from the inductor to the substrate is eliminated by providing a well filled with organic low dielectric constant (k) material below the inductor and providing a grounded patterned Faraday shield at the bottom of the low-k well. The invention may be fabricated on a bare silicon substrate or on an FEOL, or on SiGe, HRS (high resistivity silicon), or a device wafer such as CMOS or BiCMOS, and the like. Other substrate materials, such as Gas, quartz, and the like could be used if the method of etching the well is modified accordingly.

BRIEF DESCRIPTION OF THE DRAWINGS

FIG. 1 is an equation which defines Q.

DETAILED DESCRIPTION OF THE INVENTION

Figure 2A:
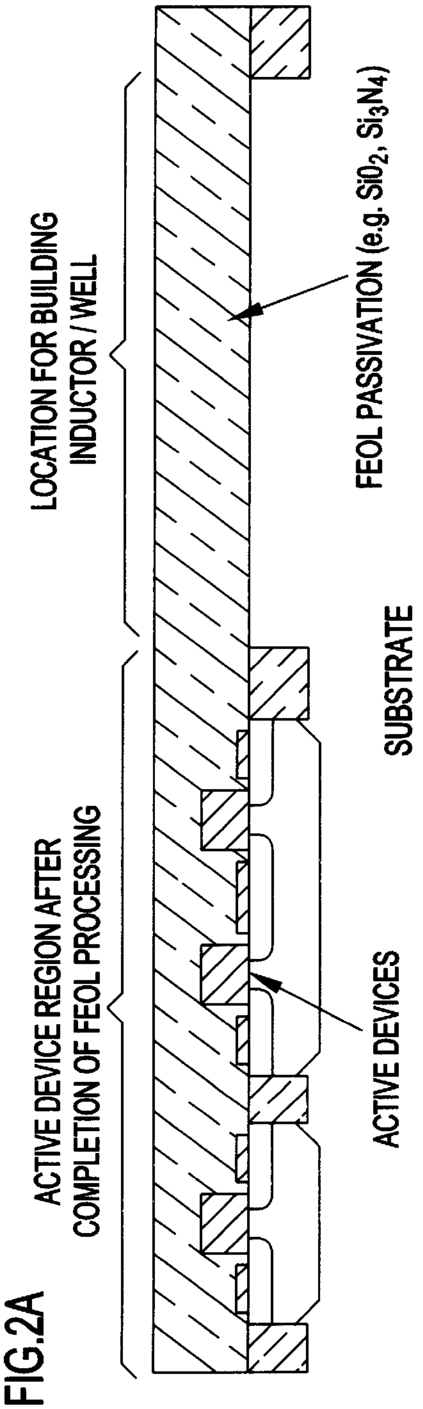
FIG. 2A shows the context in cross section and rotated 90 degrees in which well (1) shown in 2B is to be located.
Figure 2B:
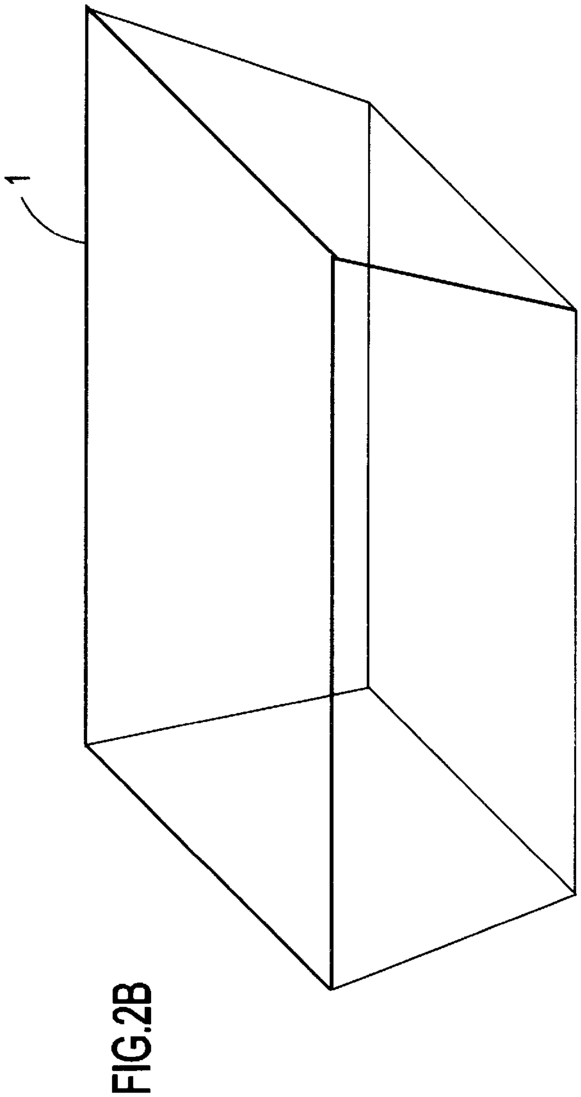
Figure 3A:
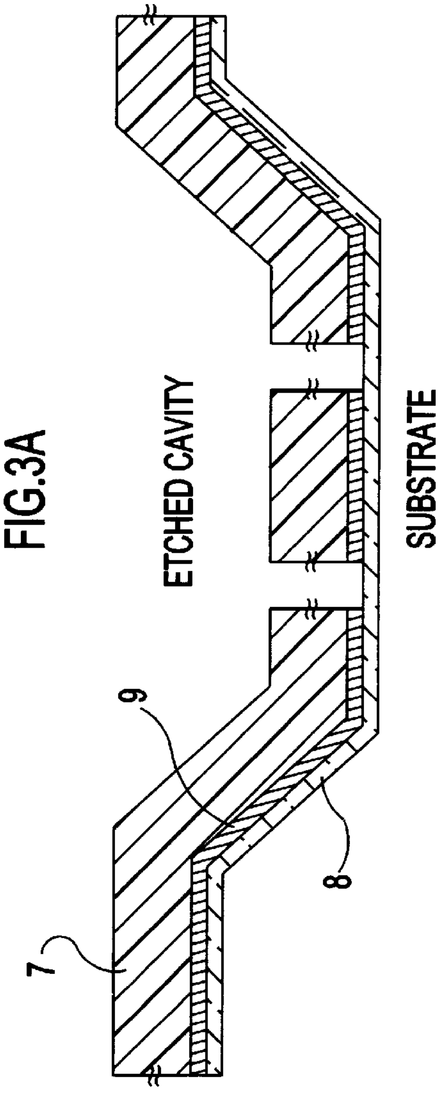
FIG. 3A shows in cross-section and rotated 90 degrees the well which is shown in FIG. 2B after applying insulator (8), conductor (9) and photoresist mask (7) and patterning the conductor (9) and mask (7) prior to depositing the groundplane (Faraday shield) (2) shown in 3B.

A wider choice of material will be available for filling the wells in a structure intended for BEOL if fabrication of the FEOL (front-end-of-line) processing, i.e. the silicon substrate and active devices thereon shown in FIG. 2A, preferably is first completed. In that way the well structure does not risk exposure to subsequent processing that may equal or exceed 400 degrees C. Beginning, then, with the FEOL silicon substrate which is coated with a passivation/insulation layer such as SiO2, Si3N4, or BPSG (boron-phosphorous doped silicate glass), a well is patterned to correspond to an area which is marginally larger than that of the of the intended inductor and directly below it. The pattern for the well is etched through an opening in a mask which will withstand the etchant into the silicon substrate using means such as reactive ion etching (RIE) or wet etching with a solution of TMAH (tetramethylammonium hydroxide), KOH (potassium hydroxide), EDP (ethylenediaminepyrochatechol) or other etchant selective for the particular substrate composition, until a well which is about 20 microns deep is formed, as seen in FIG. 2B. The side walls of the well should have sufficient slope both to facilitate wall coverage by insulator (8), conductor (9) and photoresist (7) as shown in FIG. 3A and the formation of the ground shield (2) shown in 3B and 3C.

Figure 3B:
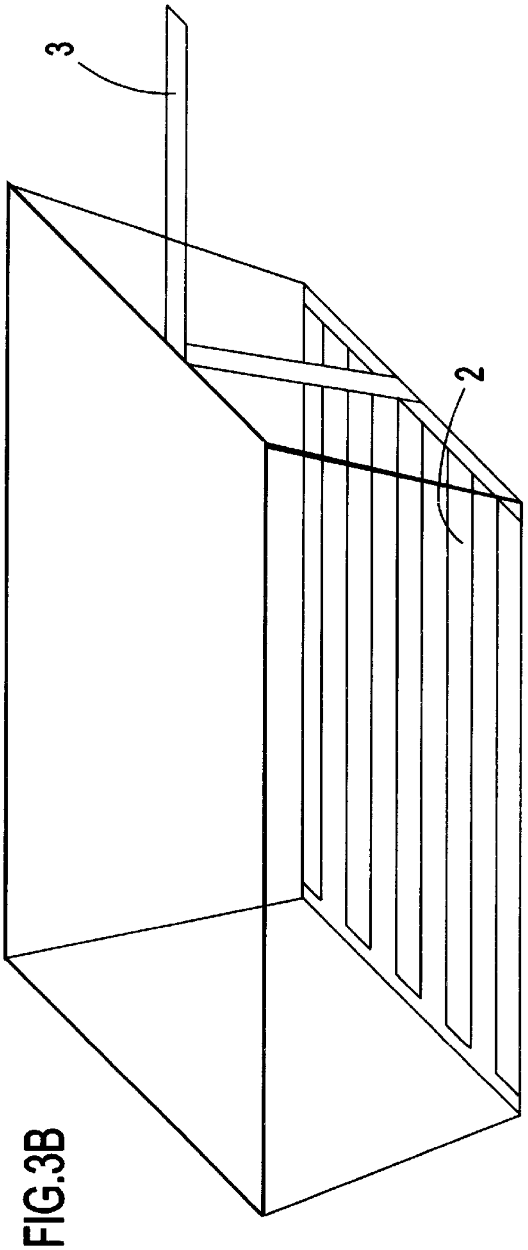
FIG. 3C shows 3A after deposition of groundplane (2) and removal of photoresist mask (7).
Figure 3C:
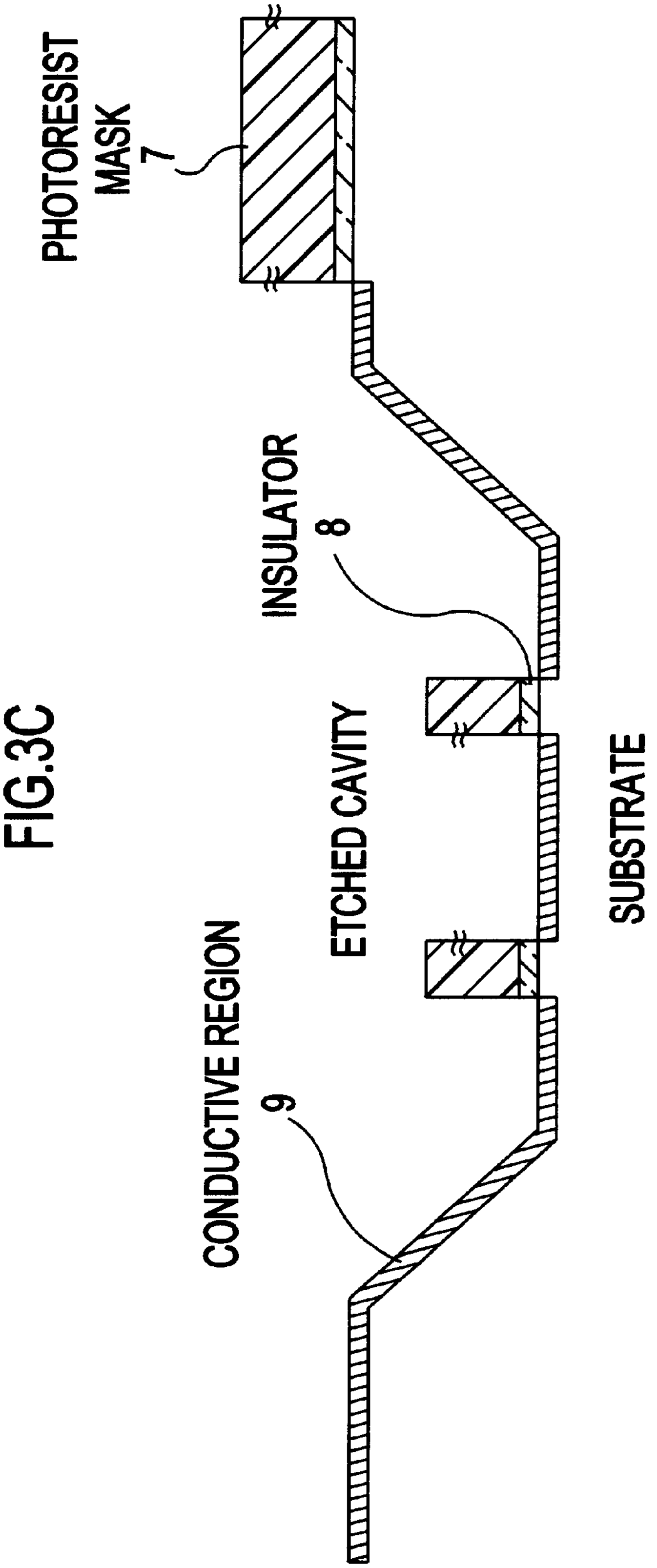
Figure 4A:
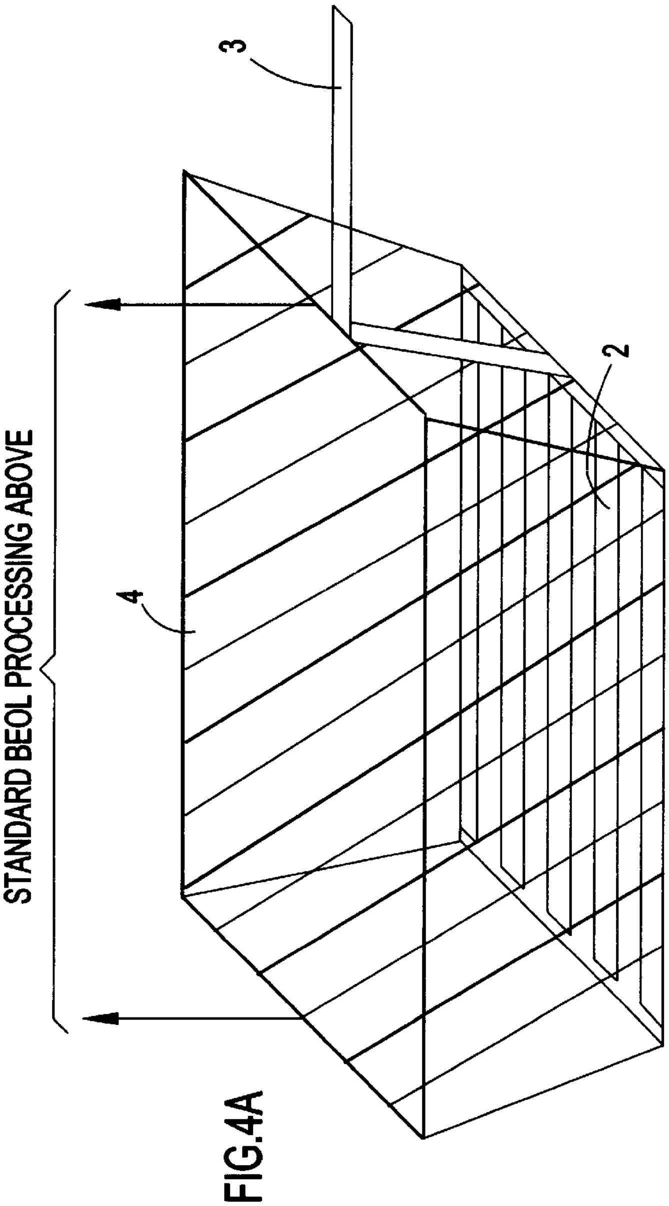
FIG. 4A shows the well and groundplane (2) of FIG. 3B, including the electrical connection (3) from the groundplane, after filling the entire well with a low-k organic dielectric (4); two sides and the bottom are shown as open for understanding of the shield position. 4B shows the same in cross-section at 90 degrees rotation after planarizing.
Figure 4B:
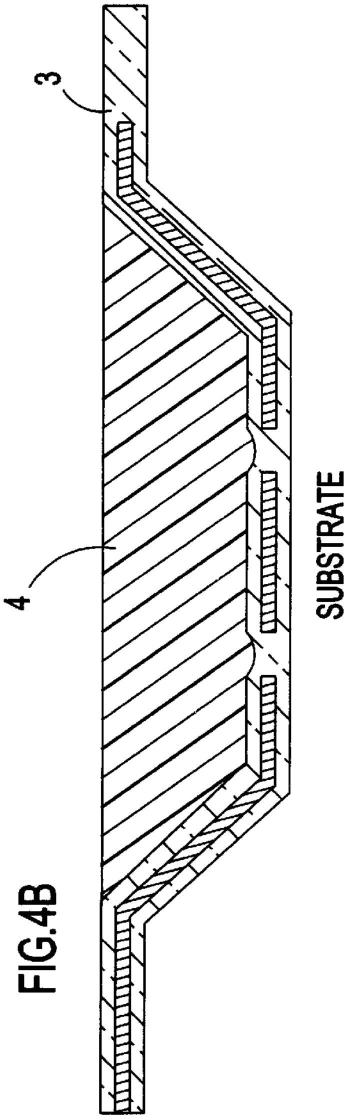
Figure 5:
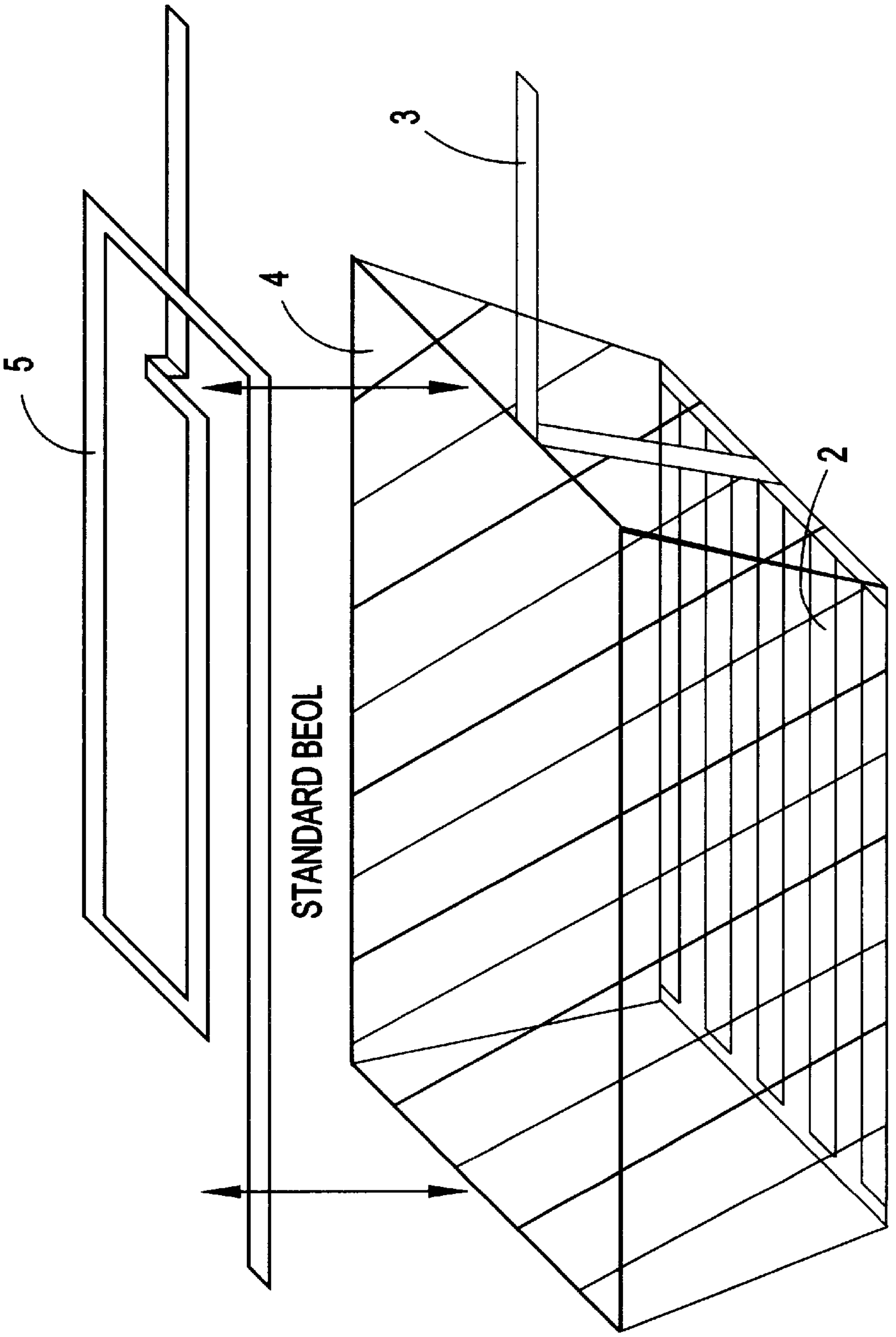
FIG. 5 shows the filled well of FIG. 4A in relation to the spiral inductor (5) integrated in the standard BEOL.

The bottom and sides of the well are then coated with a second passivation/insulation layer (8) of SiO2, Si3N4, BPSG or other such material, followed by a layer of conductive material (9) such as metal, doped a-silicon, doped polysilicon or silicide. Photoresist (7), such as AZ4611, is applied over the conductive material and an elongated, segmented pattern for the Faraday ground shield (2) is opened down to the insulator (8). The pattern prevents the generation of eddy currents in the shield. A connection to ground (3) up a side of the well is also exposed, developed and etched as seen in FIG. 3B. Alternatively, the ground shield could be formed by doping the silicon at the bottom of the well through a masked pattern to make the doped area less resistive with respect to the substrate. A low dielectric constant (k) material, such as polyimide 2560 or SiLK (4), is applied to completely fill the well. SiLK is a partially polymerized oligomeric material in a high purity NMP carrier solvent. The filling of the well is indicated in FIG. 4A; however two walls and the ground shield are left open in the drawing for ease of visualization. The filled well is shown rotated in cross-section in FIG. 4B. For a well which is about 20 microns deep, 25 microns of polyimide would be appropriate to overfill the well and coat the surface of the wafer outside the well. The dielectric is then cured, if polyimide, to 400 degrees C, and if the surface across the wafer and filled well is uneven it is made even by CMP, such as polishing with an alumina slurry, stopping at the passivation/insulation layer on the surface outside the well as shown in FIG. 4B. This step in the process may have to be repeated to ensure coplanarity of the surface of the filled well with the surrounding passivation/insulation layer surface. The planar inductor coil (5) is formed over the filled well as shown in FIG. 5. Additional process steps are taken to fabricate the complete IC structure desired.

Decreasing parasitic capacitance between the spiral and the substrate without the addition of prohibitively thick dielectric layering, and providing a Faraday shield ground plane which eliminates any remaining parasitic capacitance in addition to its being shaped to avoid eddy current problems, results in a robust IC structure which includes a low loss spiral inductor having a high Q at RF and microwave frequencies.

Figure 6:
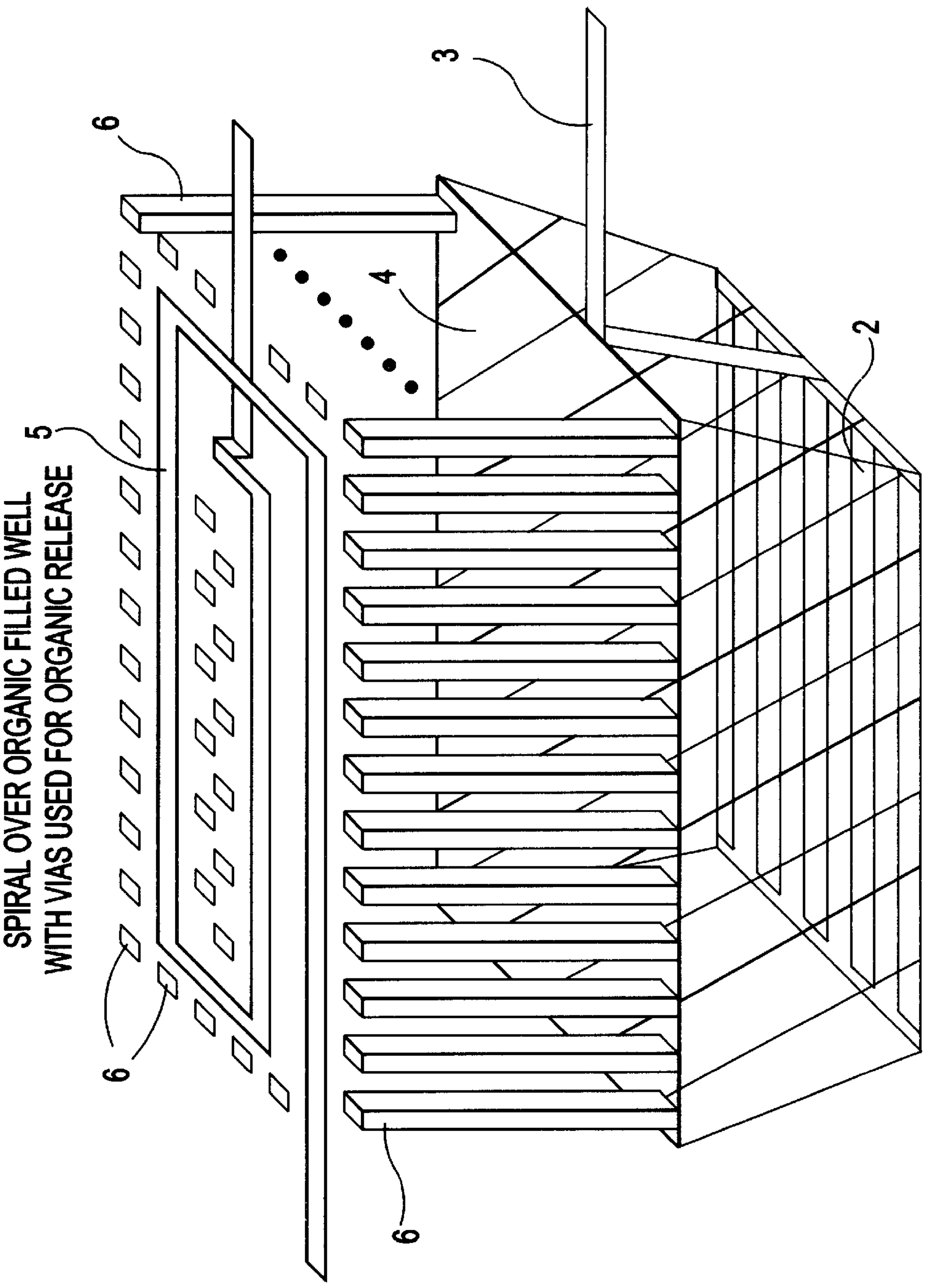
FIG. 6 shows the structure of FIG. 5 after adding open vias (6) in preparation for the alternate embodiment shown in FIG. 7. As in FIG. 4A, the filled well is shown as open in order to view shield (2).
Figure 7:
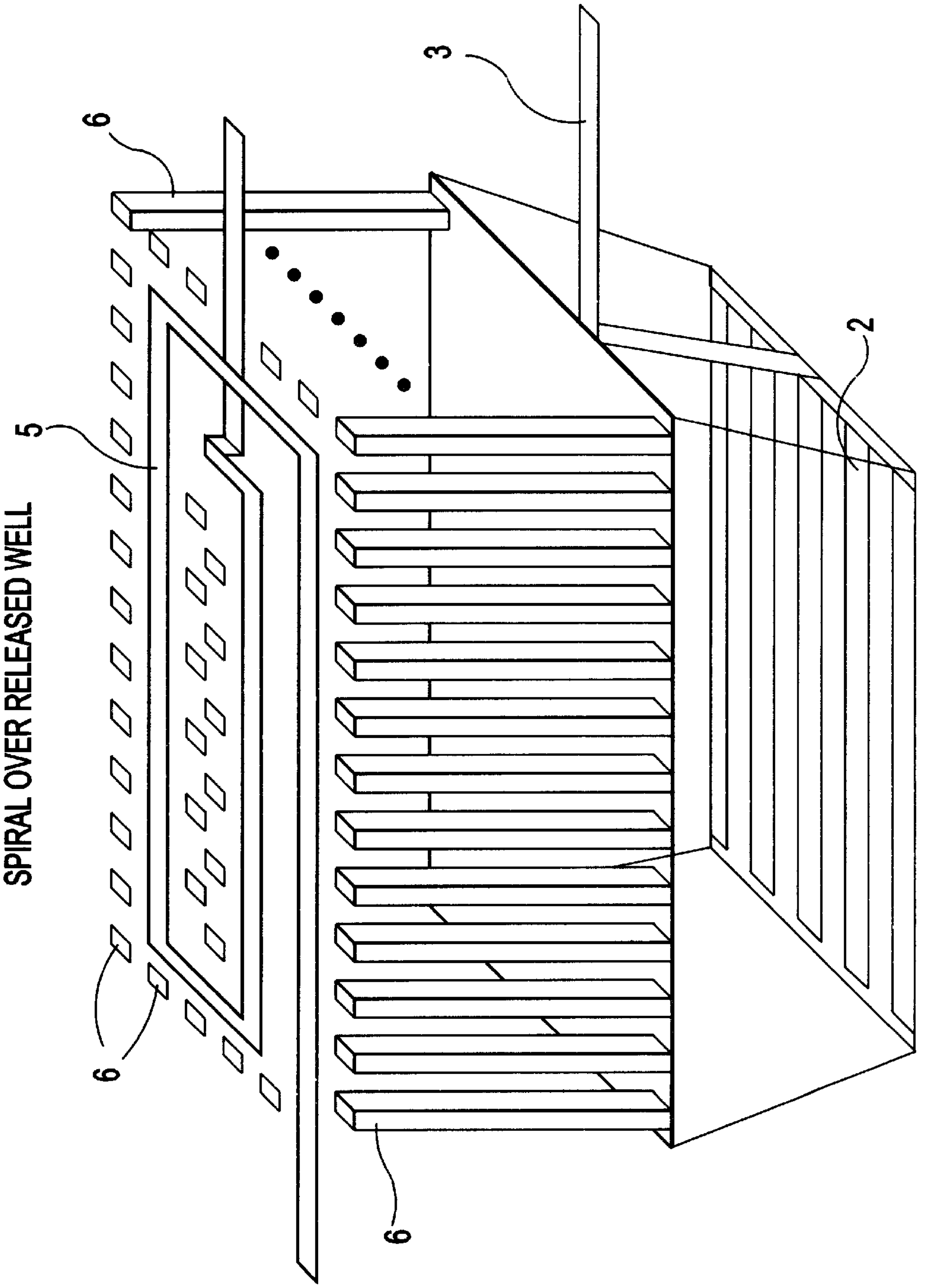
FIG. 7 shows the structure of FIG. 6 after the organic dielectric (4) has been removed from the well through the open vias (6), leaving air dielectric.

In an alternate embodiment of the invention, after the formation of the inductor coil a pattern is etched between the coils of the inductor to form empty air space in the well below the inductor. Using RIE, the dielectric in the well is removed from under the inductor through open vias, as shown in FIG. 6 and FIG. 7, leaving an air dielectric in the well.

While the invention has been shown and described in particular embodiments, variations in process steps, materials and structures will be obvious to those skilled in the art.

We claim:

1. An inductor device for an integrated circuit, comprising:

a. a semiconductor substrate;

b. a well in the substrate, the well having a floor;

c. a conductive ground shield disposed planarly on the well floor in parallel, elongated segments which are connected commonly and connected to ground; and d. a spiral planar inductor disposed above the well and parallel to the ground shield.

2. The device recited in claim 1, wherein the well is slope-walled.

3. The device recited in claim 2, wherein the slope-walled well is filled with a low-k organic dielectric material, or with air.

4. The device recited in claim 3, wherein the low-k organic dielectric material comprises polyimide or SiLK.

5. The device recited in claim 1, wherein the conductive ground shield is comprised of a metal, doped silicon, doped polysilicon or silicide.

6. The device recited in claim 1, wherein the conductive ground shield is separated from the substrate by a passivation/insulation material selected from the group consisting of SiO2, Si3N4 and BPSG.

* * * * *